United States Patent [19]

Van Dine, et al.

[11] Patent Number: 4,675,467
[45] Date of Patent: Jun. 23, 1987

[54] DIRECTED ENERGY CONVERSION OF SEMICONDUCTOR MATERIALS

[75] Inventors: John E. Van Dine, Westfield;
Herbert A. Weakliem, Pennington;
Zoltan Kiss, Belle Mead; Alan E. Delahoy, Rocky Hill, all of N.J.

[73] Assignee: Chronar Corp., Princeton, N.J.

[21] Appl. No.: 859,505

[22] Filed: Apr. 5, 1986

[51] Int. Cl.⁴ ...................... H01L 27/14; H01L 31/18
[52] U.S. Cl. ..................................... 136/249; 29/572;
29/574; 29/584; 219/121 LZ; 219/121 LM;
357/30
[58] Field of Search .......................... 29/572, 574, 584;
136/249 MS; 219/121 LZ, 121 LM; 357/30

[56] References Cited
U.S. PATENT DOCUMENTS
4,570,332  2/1986  Yamauchi ............................ 29/586

*Primary Examiner*—Aaron Weisstuch
*Attorney, Agent, or Firm*—George E. Kersey

[57] ABSTRACT

Directed energy conversion of semiconductors by the directed energy fusion of a selective region of a semiconductor layer to provide a conductive path through the layer. A conductive path is formed through a semiconductive layer through opposed electrodes by conversion of the semiconductive region, for example, by laser energy applied to change the structure in the region extending between the electrodes. The change in conductivity of the path is monitored and used to control the formation of the conductive path by controlling the directed energy source.

18 Claims, 3 Drawing Figures

DIRECTED ENERGY CONVERSION OF SEMICONDUCTOR MATERIALS

BACKGROUND OF THE INVENTION

This invention relates to semiconductive materials, particularly to the conversion of such materials to change their characteristics, and more particularly to the conversion of a limited region of a semiconductive material to permit conduction in solar cells.

It is standard practice to form solar cells by depositing successive patterned layers upon a substrate. Alternatively, the layers are patterned after deposition by removing selected portions to form individual solar cells. The resulting cells are joined externally to form solar arrays. An example is provided by the Borden U.S. Pat. No. 4,278,473. Such arrays are expensive and difficult to manufacture. The patterning processes also reduce the active areas of the cells.

Another type of solar cell is described in the Kuwano et al U.S. Pat. No. 4,281,208 where an unpatterned active layer has electrical interconnections beyond the edge of the layer. This unpatterned structure is easier to manufacture than patterned structures. It is, however, limited in size by the electrode sheet resistance because the interconnection is made at the ends of the cells. As a result, such a panel is impractical for most uses.

Still another type of solar cell is disclosed in Morel et al U.S. Pat. No. 4,517,403 where a continuous semiconductive film carries front and back electrodes. Electrical connection between the electrodes is said to be provided directly through the film itself by diffusion of metal through the film. In particular, Morel uses "stitch bars" on one set of electrodes over which a semiconductive film extends continuously and completely. The stitch bars are tall and rough compared to the thickness of the film. Otherwise the desired conductive passage through the film will not exist. Where the stitch bars are relatively high the application of heat supposedly can cause diffusion of the electrode material, and possibly the material of the stitch bars, into the semiconductive film. The resulting diffused region is allegedly more conductive than the bulk of the film and is said to enhance cell interconnection. The conductive metallic materials allegedly may diffuse into the film as discrete atoms or exist as particulates occupying interstitial sites within the film. It is desirable to apply the heat only at localized areas within preselected areas. A laser beam may be used to melt the contact and the film material to form a eutectic composition of the two materials, or the laser beam may simply heat the materials enough to enhance diffusion.

In practice, heating to produce diffusion does not operate satisfactorily. In particular, heating using a laser beam is incapable of providing the required diffusion. Consequently, in applications of the Morel disclosure it has been necessary to allow the stitch bars of one set of electrodes to extend completely through the semiconductive film into contact with another set of electrodes, since attempted interconnection by diffusion is unworkable.

Accordingly, it is an object of the invention to facilitate the interconnection of electrodes with respect to an intervening semiconductive layer. A related object is to facilitate the production of conductive regions in semiconductive materials.

Still another object of the invention is to overcome the difficulties and limitations associated with the prior art.

Another object is to overcome the difficulties associated with the technique described by Morel where the heating of metallic material is alleged to produce diffusion through an intervening film.

SUMMARY OF THE INVENTION

In accomplishing the foregoing and related objects, the invention provides for the directed energy fusion of a selected region of a semiconductor layer to provide a conductive path through the layer.

A device in accordance with the invention includes a continuous layer having opposed surfaces, with one surface having a plurality of discrete electrodes and the opposite surface having a corresponding plurality of discrete electrodes opposite the first set of electrodes. A conductive region extends through the continuous layer from at least one of the electrodes to a corresponding opposite one of the electrodes. The conductive region which extends through the layer from one electrode to another can be transparent. The transparency is caused by channels in the layer extending from said one electrode to the other.

In accordance with one aspect of the invention, the semiconductor layer can be a thin film of controllably doped semiconductor, which can be hydrogenated silicon or germanium. One set of the electrodes is transparent to radiation. Where the electrodes are transparent to light, the device is a photocell. Where the electrodes are transparent to solar energy, the device is a solar cell.

In a method of manufacturing a radiation sensitive device in accordance with the invention, a plurality of spaced-apart electrodes in a first set is formed on a substrate and a continuous layer of semiconductor material is formed over the electrodes and the exposed substrate between the electrodes. A plurality of spaced-apart electrodes in a second set is formed on the semiconductor layer, each electrode of the first set overlying an electrode of a second set to define an intervening radiation sensitive region. An electrical connection is provided through the continuous semiconductor layer between at least one electrode of the first set and a corresponding electrode of the second set. The electrical connection is formed by conversion of the material of said layer, with the power of conversion desirably adjusted to achieve transparency in the layer. The level of transparency is indicated by the existence of pinholes which extend through the layer.

In a method of producing an electrical connection from a front electrode to a back electrode through a semiconductive layer, a semiconductive layer overlies the back electrode and the front overlies the semiconductive layer. A conductive path through the semiconductive layer joins the first electrode to the second electrode. The conductive path is formed by directed energy conversion of the semiconductive region between the first electrode and the second electrode. Laser conversion is desirable, with the laser energy applied to change the structure of the region extending between the front electrode and the back electrode. The change in conductivity of the path between the first electrode and the second electrode can be monitored and used to control the formation of the conductive path. This can be done by controlling the directed energy source. The directed energy can originate at a laser source and the conductivity of the path can be monitored by the transparency.

DESCRIPTION OF THE DRAWINGS

Other aspects of the invention will become apparent after considering several illustrative embodiments taken in conjunction with the drawings, in which.

DETAILED DESCRIPTION

Figure 1:
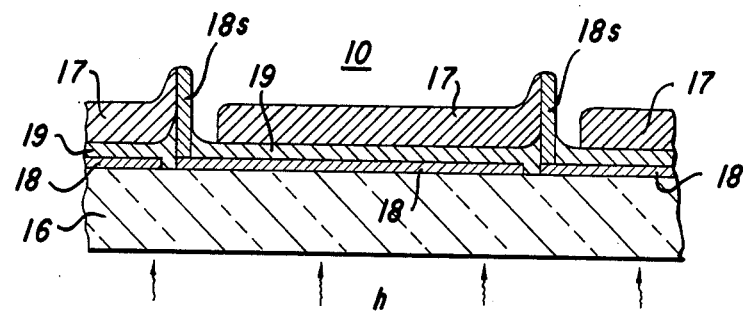
FIG. 1 is a cross-sectional view of a portion of a monolithic solar cell panel in accordance with the prior art.

With reference to FIG. 1, there is illustrated a commercial implementation of a monolithic thin film solar panel 10 disclosed in U.S. Pat. No. 4,517,403. The solar panel 10 of FIG. 1 is formed by a transparent substrate 16, a set of transparent front electrodes 18, a continuous thin film 19 of photovoltaic material, and a patterned set of individual back electrodes 17. Each of the back electrodes 17 is separated from adjoining back electrodes and overlies a photovoltaic region of the thin film 19. Ech front electrode 18 is transparent and includes a contact portion or stitch bar 18s.

Each stitch bar 18s extends through the thin film 19 and into contact with one of the back electrodes 17 of a prior photovoltaic region. In theory, according to U.S. Pat. No. 4,517,403 it should be possible to diffuse metallic material through the thin film 19 in order to join the stitch bars 18s to their corresponding back electrodes 17. In practice, metallic diffusion to achieve conduction does not take place and it is therefore necessary to have the stitch bar 18s extend completely through the thin film 19.

Figure 2A:
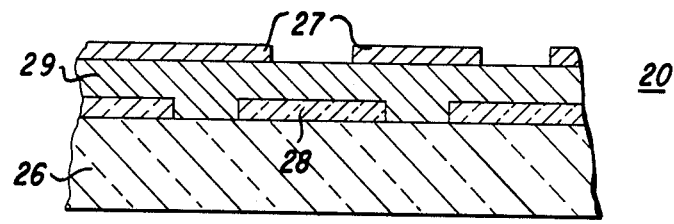
FIG. 2A is a cross-sectional view of a panel for further processing in accordance with the invention.

The present invention completely avoids the need for stitch bars and the need to have such structure penetrate the thin film of the photovoltaic material into contact with the back electrode. Referring now to structure 20 shown in FIG. 2A, a transparent substrate 26 includes a patterned set of transparent front electrodes 28. It is to be emphasized that the front electrodes 28 do not include any kind of projection, such as the stitch bars 18s of FIG. 1, through the adjoining thin film 29 of hydrogenated photovoltaic material. In addition, the structure 20 of FIG. 2A includes a patterned set of back electrodes 27. The patterning of FIG. 2A may take place in any suitable fashion to separate the adjoining back electrodes 27 and exposes the thin film photovoltaic layer 29.

Figure 2B:
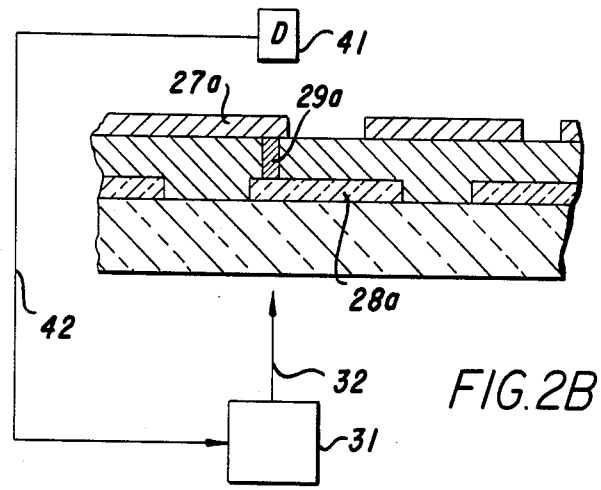
FIG. 2B is a cross-sectional view of the panel of FIG. 2A after modification in accordance with the invention and illustrating schematic view of a portion of the control circuitry for achieving the desired modification in accordance with the invention.

Once the back electrodes 27 have been formed, a laser 31 is used in the position indicated in FIG. 2B so that the beam 32 passes through an edge of one of the front electrodes 28, illustratively the electrode 28-a through the thin film 29 and into an edge portion of an overlapping back electrode 27, illustrtatively the back electrode 27-a. Since the desired contact of the back electrode 27a with corresponding front electrode 28a through the thin film 29 cannot be achieved by diffusion, i.e., causing the migration of metallic particles from one of the electrodes 27a or 28a to the other electrode, or vice versa, and since the front electrodes 28 do not include any structure corresponding to stitch bars, the invention provides an entirely different technique for realizing a suitable conduction path, illustratively designated 29a in FIG. 2B, through the thin film 29.

The thin film layer 29 is initially opaque to visible light. It has been discovered that if the laser beam 32, e.g. in the near infra-red region, is applied until the path 29a becomes transparent, the material of the path 29a becomes conductive. The laser beam is in general focused on the work using a lens. With a sufficiently high beam intensity a cylindrical lens is required to obtain suitable power densities and realize the aforementioned conducting state. When the conductive state is realized the desired electrical interconnection between front and back electrodes is attained without the need for the stitch bars and any attempt to diffuse metallic particles through the photovoltaic film.

One implementation of the conversion of the thin film material 29 from opacity to transparency is illustrated. A detector is positioned opposite the laser 31. The output of the detector 41 is applied over a control line 42 to the laser 31. After the laser is activated, at low initial power, the transparency of the path 29p is continually monitored. When the transparency reaches a suitable level, a control signal over the line 42 deactivates the laser 31. The conductive path 29p is characterized by the presence of channels which extend from the back electrode to the front electrode. These channels are formed by hydrogen evolution from the hydrogenated semiconductor matter. It is these channels which are responsible for the transparency. It is speculated that by contrast with the supposed diffusion that takes place in the prior art, the present invention permits metallic fingers, e.g., of aluminum to extend into contact with the opposite electrode.

It will be appreciated that the use of a laser source is merely illustrative and that other energy sources such as those making use of molecular beams and other forms of radiation may be used instead. It will also be appreciated that "transparency" is a matter of degree and that, with switch monitoring, films which are not visually transparent can be rendered conductive.

Other aspects of the invention will be apparent to those of ordinary skill in the art. It will be understood that the foregoing description is for illustration only and that suitable modifications may be made without departing from the spirit and scope of the invention.

We claim:

1. A semiconductor device comprising:
   a continuous semiconductive layer having opposed surfaces;
   means at one surface providing a first plurality of discrete electrodes;
   means at the opposite surface providing a second plurality of discrete electrodes which are non-reactive with the continuous semiconductive layer and positioned opposite the first plurality of electrodes; and
   a transparent converted region extending through said continuous semiconductive layer from at least one of said first plurality of electrodes to a corresponding opposite one of said second plurality of electrodes.

2. The device of claim 1 wherein the transparent converted region comprises channels in said layer extending from said one electrode of said first plurality to the opposite electrode of said second plurality.

3. The device of claim 1 wherein said continuous semiconductor layer comprises a thin film of controllably doped semiconductor.

4. The device of claim 3 wherein said semiconductor comprises hydrogenated silicon or germanium.

5. The device of claim 3 wherein one of said pluralities of electrodes is transparent to radiation.

6. The device of claim 5 wherein said one plurality of electrodes is transparent to light and said device is a photocell.

7. The device of claim 6 wherein said one plurality of electrodes is transparent to solar energy and said device is a solar cell.

8. A method of manufacturing a radiation sensitive semiconductor device comprising the steps of:
   (a) forming a first plurality of spaced-apart electrodes on a substrate;
   (b) forming a continuous semiconductive layer over said electrodes and the substrate;
   (c) forming a second plurality of spaced-apart electrodes on said continuous semiconductor layer, each electrode of said second plurality overlying an electrode of said second plurality and being non-reactive with said semiconductor layer to define a radiation sensitive region therebetween; and
   (d) providing a converted region extending through said semiconductive layer between at least one electrode of said first plurality and a corresponding electrode of said second plurality to provide an electrical connection therebetween, said electrical connection being provided by conductive fingers that extend through the material of said semiconductor layer and formed by adjusting the power of conversion of said region to achieve transparency in said semiconductive layer.

9. The method of claim 8 wherein the level of transparency is indicated by the existence of channels which extend through said semiconductor layer.

10. The method of claim 8 wherein the energy of conversion is directed through said substrate.

11. The method of producing a contact from a first electrode to a second electrode through a semiconductive layer which comprises the steps of:
   (a) forming the first electrode;
   (b) overlying the first electrode with said semiconductive layer;
   (c) overlying said semiconductive layer with the second electrode;
   (d) forming a converted region extending through the semiconductive layer thereby conductively joining the first electrode to the second electrode; and
   (e) monitoring the change in conductivity in the path between said first electrode and said second electrode to control the formation of the converted region extending between said first electrode and said second electrode.

12. The method of claim 11 wherein the converted region is formed by energy directed into the semiconductive region between the first electrode and the second electrode.

13. The method of claim 12 wherein the directed energy is achieved by laser.

14. The method of claim 12 wherein the directed energy is applied to change the structure of said region extending between the first electrode and the second electrode.

15. The method of claim 11 wherein said path is formed by directed energy and the change in conductivity of said path controls the directed energy source.

16. The method of claim 15 wherein the directed energy originates at a laser source and the conductivity of said path is monitored by the transparency thereof.

17. The method of claim 15 wherein the directed energy is in the near infra-red region.

18. The method of claim 15 wherein said directed energy is applied until a selected threshold of transparency is reached.

* * * * *